US006842135B2

(12) United States Patent
Laflaquiere

(10) Patent No.: US 6,842,135 B2
(45) Date of Patent: Jan. 11, 2005

(54) RAMP GENERATOR

(75) Inventor: Arnaud Laflaquiere, Edinburgh (GB)

(73) Assignee: STMicroelectronics Limited, Buckinghamshire (GB)

( * ) Notice: Subject to any disclaimer, the term of this patent is extended or adjusted under 35 U.S.C. 154(b) by 0 days.

(21) Appl. No.: 10/385,202

(22) Filed: Mar. 10, 2003

(65) Prior Publication Data
US 2004/0160349 A1 Aug. 19, 2004

(30) Foreign Application Priority Data

Feb. 15, 2003  (EP) ............................................ 03250941

(51) Int. Cl.[7] .............................................. H03M 1/78
(52) U.S. Cl. ...................................... 341/154; 341/144
(58) Field of Search ................................ 341/154, 147; 327/105, 536

(56) References Cited

U.S. PATENT DOCUMENTS 4,447,747 A * 5/1984 LaPotin ....................... 327/105
5,604,501 A * 2/1997 McPartland ................. 341/144
5,703,588 A * 12/1997 Rivoir et al. ................ 341/159
5,945,870 A * 8/1999 Chu et al. .................... 327/536
6,023,133 A * 2/2000 Leung et al. .......... 315/368.21
6,617,989 B2 * 9/2003 Deak .......................... 341/144

FOREIGN PATENT DOCUMENTS

EP    1298800 A1 *   4/2003

OTHER PUBLICATIONS

Bailey, "Ramp Generator For Image sensor ADC", U.S. Appl. No. 10/254,443, filed Sep. 25, 2002.*

* cited by examiner

Primary Examiner—Jean Bruner Jeanglaude
(74) Attorney, Agent, or Firm—Lisa K. Jorgenson; Allen, Dyer, Doppelt, Milbrath & Gilchrist, P.A.

(57) ABSTRACT

A ramp generator includes a resistance ladder (10) supplied with a constant current. Switches are closed in sequence on the resistance ladder to generate the ramp voltage. By using control logic to decode the sequence, a looped shift register is used to close the switches.

20 Claims, 2 Drawing Sheets

RAMP GENERATOR

FIELD OF THE INVENTION

The present invention relates to a ramp generator that can be used in an analog-to-digital converter (ADC), and to an ADC including a ramp generator. A field of application for the present invention is in solid-state image converters.

BACKGROUND OF THE INVENTION

In CMOS image sensors an ADC arrangement is used wherein a voltage of each pixel is compared with a ramp voltage. At the point where the ramp voltage equals the pixel voltage, a comparator latches a digital count value into a memory. In this architecture, the resolution of the ADC is directly related to the resolution and linearity of the ramp generation circuitry.

Known ramp generators using ADCs, switched capacitor integrators, charge pumps or the use of current into a capacitor suffer from a number of problems, such as the following: offsets, achieving the necessary gain within the time constants required for settling, area and power inefficiency, non-monotonicity, and process/temperature dependence.

Shift registers in combination with a resistance ladder, as shown in FIG. 1, have also been used as ramp generators. In this arrangement the ramp voltage Vramp is generated by sequentially closing each switch 102 on the resistance ladder 104, thereby tapping the master voltage Vm at different intervals. The sequential closing of the switches is provided by a shift register 106 which has a number of shift register elements 108 corresponding to the number of resistive elements in the resistance ladder 104. The shift register 106 is provided with a clock pulse signal and a token signal where the token signal has a single high pulse. This single high pulse is passed through the shift register elements 108, and thereby closing the respective switches 102 on each clock pulse.

This type of ramp generator can pose a significant problem in terms of physical size since a 12 bit ramp generator requires 2048 shift register elements and 2048 resistive elements. In terms of integrated circuits (ICs), shift register elements are relatively large, requiring a minimum of 8 transistors. This can be prohibitive when IC space is at a premium and the quality of ramp generation is paramount.

Also, shift register elements have been used to control more than one switch, thereby reducing the number of shift register elements required. The methods used have not enabled a reduction in size of the overall ramp generator, but in fact have increased the overall size by using a digital control circuit to control the closing of the switches. This had advantages in other areas but significantly increases the complexity and the physical size of the ramp generator when integrated on an integrated circuit.

SUMMARY OF THE INVENTION

An object of the present invention is to provide a ramp generator that is suitable for inclusion in an ADC in an image sensor, and one that avoids or mitigates the above described problems.

The present invention provides a ramp generator comprising a resistance ladder formed by a number of resistance elements connected in series, a current source arranged to pass a controlled current through the resistance ladder, a voltage output, and a plurality of switches for connecting the voltage output to points on the resistance ladder between the resistance elements. Switch control means comprise a plurality of switch controls for closing the switches in a sequential manner. The ramp generator may be characterized in that it also comprises decoding means to determine the current switch that is being operated. The decoding means enables the plurality of switch controls to control a plurality of switches.

The switch control means may comprise a shift register, which comprises a number of shift register elements connected to receive a clock signal and a token signal from the decoding means. The decoding means may enable the shift register to receive the token signal more than once, thereby creating a looped shift register.

The decoding means may also enable the switch control means to operate a set of switches corresponding to a set of resistive elements proportional, in number, to half the number of switch controls. The decoding means may receive an indication that the token signal has passed through half the number of switch controls.

BRIEF DESCRIPTION OF THE DRAWINGS

Embodiments of the invention will now be described, by way of example only, with reference to the drawings, in which.

DETAILED DESCRIPTION OF THE PREFERRED EMBODIMENTS

Figure 1:
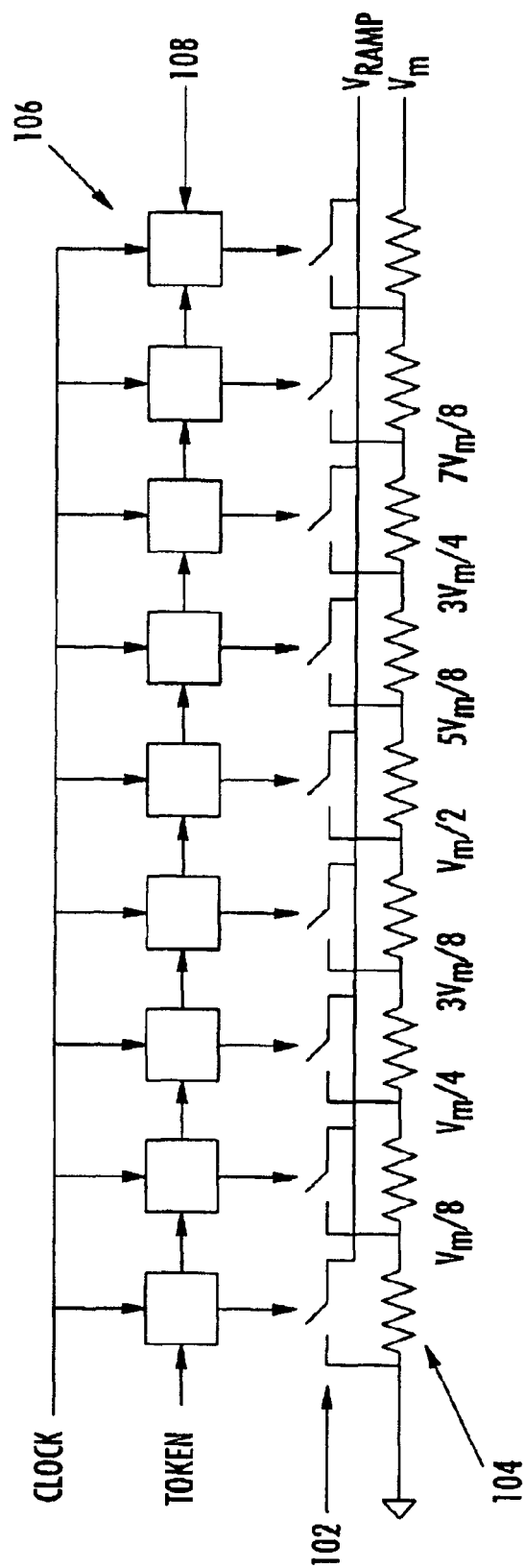
FIG. 1 is a block diagram of a ramp generator based on a shift register architecture in accordance with the prior art.
Figure 2:
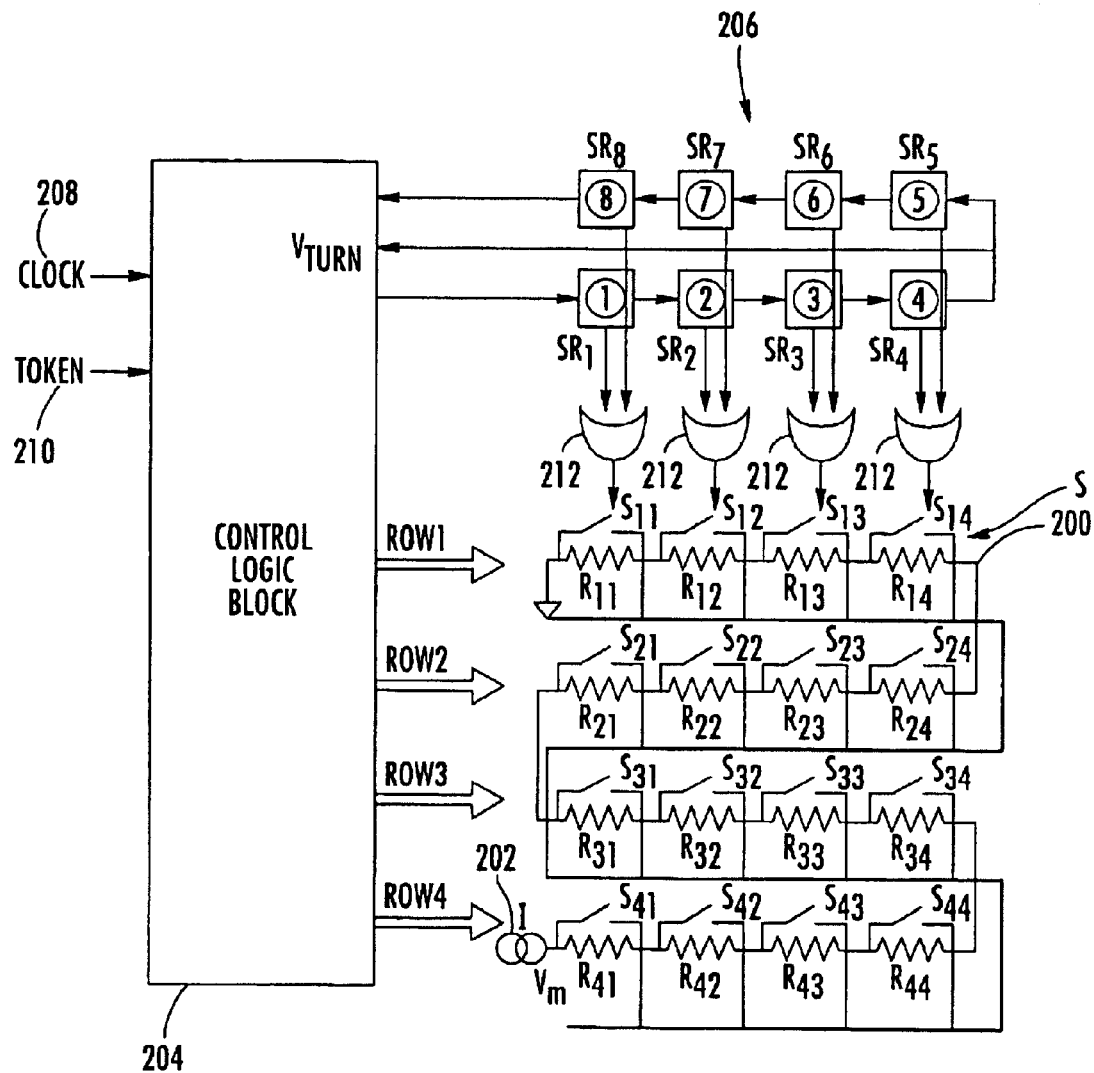
FIG. 2 is a block diagram of a ramp generator in accordance with the present invention.

Referring to FIG. 2, a resistance ladder 200 is formed by a series of resistors $R_{11} \ldots R_{44}$. The resistance ladder 200 is supplied with a constant current I by a constant current source 202. An output $V_{Ramp}$ can be tapped from each point along the resistance ladder 200 by the operation of switches $S_{11}$–$S_{44}$.

By operating the switches $S_{11}$–$S_{44}$ sequentially, with only one switch being closed at a time, a stepped ramp voltage will be obtained at $V_{RAMP}$. If all the resistors R have the same value $R_{UNIT}$, then $$V_{RAMP} = N * R_{UNIT} * I$$

where N is the number of resistors in series when the respective switch is closed.

The switches $S_{11}$–$S_{44}$ are operated by a combination of a control logic block 204 and a shift register 206. The control logic block 204 accepts a clock input 208 and a token input 210. The clock input 208 is a regular clock pulse signal at a pre-determined frequency which ultimately governs the length of time a single voltage ramp takes to rise.

The token input 210 is a single high pulse which is placed initially at the shift register element $SR_1$ and moves one shift register element each time a clock pulse signal is received. The control logic block 204 initializes the shift register 206 by passing the clock input 208 and the token input 210. At the same time, the control logic block 204 also initializes the switches S11–S14 of the first row of the resistance ladder. When the token input 210 is at the shift register element SR1, the high signal is passed through the OR gate 212 and switch $S_{11}$ closes. The output ramp voltage $V_{RAMP}$, in this case, is then equal to:

$$V_{RAMP} = 1 * I = V_m / 16$$

As the token input 210 moves to the next shift register element on the next clock pulse signal, $S_{11}$ opens and $S_{12}$ closes. The output ramp voltage $V_{RAMP}$ changes to:

$$V_{RAMP} = 2*R_{UNIT}*I = 2*V_m/16$$

This continues on each clock pulse signal for closing the next switch in sequence, and opening the previously closed switch until when the token input 210 passes between shift register elements $SR_4$ and $SR_5$. At this point, the control logic block 204 receives a signal $V_{turn}$ which deactivates the switches $S_{11}$–$S_{14}$ on row1 and activates the switches $S_{21}$–$S_{24}$ on row2.

The token input 210 now at shift register element $SR_5$ passes through the common OR gate 212 and closes switch $S_{24}$ as the switches $S_{21}$–$S_{24}$ in row2 have been enabled by control logic block 204. Switches $S_{23}$, $S_{22}$ and $S_{21}$ are then closed in sequence by the token input 210 passing between the shift register elements $SR_6$, $SR_7$ and $SR_8$.

The token input 210 is then received by control logic block 204 which disables switches $S_{21}$–$S_{24}$ and enables switches $S_{11}$–$S_{34}$. The token input 210 is then passed back to shift register element $SR_1$ and switch $S_{31}$ is closed. The process is then repeated as in the first loop, with the only difference being that the control logic block 204 disables row3 of switches $S_{31}$–$S_{34}$ and enables row4 of switches $S_{41}$–$S_{44}$ when the $V_{TURN}$ signal is received.

Obviously, FIG. 2 shows that a scaled down version of this architecture can be applied to obtain the required resolution. Typically, this is 12 bits and would correspond to 4096 resistors and the same number of shift register elements, and therefore rows of resistors and switches could be chosen dependent on the architecture required.

The physical space required on an integrated circuit (IC) by an embodiment of the present invention is significantly less compared with prior art shift register ramp generators. This is due to using less shift register elements, which are comparatively large on an IC, and which usually requires at least 8 transistors. In addition, the decoding means that allows the shift register elements to selectively operate more than one switch comprises logic circuits which do not require a significant amount of IC space in comparison to the amount of space saved by using less shift register elements.

The proportion of shift register elements to resistive elements is a matter of choice and any combination could be used. For example, it may be desirable to have 3 rows of shift register elements rather than two as described in the specific embodiment, and therefore having the number of rows of restive elements proportional to 3.

The ramp generator of the present invention is particularly useful in an ADC circuit but may be used in other applications. Moreover, the ADC circuit may form part of an image sensor chip, but is not limited to such use.

That which is claimed is:

1. A ramp generator comprising:
   a resistance ladder comprising a plurality of resistance elements connected together in series;
   a current source connected to said resistance ladder for passing a controlled current therethrough;
   a plurality of switches connected to said plurality of resistance elements for connecting a voltage output to points on said resistance ladder between said resistance elements;
   switch control means including a plurality of switch controls for sequentially closing said plurality of switches; and
   decoding means for determining which switch is currently being operated, and for enabling each of the plurality of switch controls to control more than one switch of said plurality of switches.

2. A ramp generator according to claim 1, wherein said switch control means comprises a shift register comprising a plurality of shift register elements connected together for receiving a clock signal and a token signal from said decoding means, said plurality of shift register elements corresponding to the plurality of switch controls.

3. A ramp generator according to claim 2, wherein said decoding means enables said shift register to receive the token signal more than once, thereby creating a looped shift register.

4. A ramp generator according to claim 1, wherein said plurality of switches are divided into sets of switches, and wherein said plurality of resistance elements are divided into sets of resistance elements; and wherein said decoding means enables said switch control means to operate a set of switches corresponding to a respective set of resistance elements, the set of resistance elements being proportional, in number, to half a number of switch controls.

5. A ramp generator according to claim 4, wherein said decoding means receives an indication that the token signal has passed through half the number of switch controls.

6. A ramp generator comprising:
   a resistance ladder comprising a plurality of resistance elements connected together in series and divided into rows of resistance elements;
   a current source connected to said resistance ladder for passing a controlled current therethrough;
   a plurality of switches connected to said plurality of resistance elements for connecting a voltage output to points on said resistance ladder between said resistance elements, said plurality of switches being divided into rows of switches corresponding to the rows of resistance elements;
   a shift register comprising a plurality of shift register elements connected together for providing a plurality of switch controls for sequentially closing said plurality of switches; and
   a decoding circuit for determining which switch is currently being operated, and for enabling each of the plurality of switch controls to control more than one switch of said plurality of switches.

7. A ramp generator according to claim 6, wherein each shift register element receives a clock signal and a token signal from said decoding circuit.

8. A ramp generator according to claim 7, wherein said decoding circuit enables said shift register to receive the token signal more than once, thereby creating a looped shift register.

9. A ramp generator according to claim 6, wherein each row of resistive elements is proportional, in number, to half a number of switch controls.

10. A ramp generator according to claim 9, wherein said decoding circuit receives an indication that the token signal has passed through half the number of switch controls.

11. A method for making a ramp generator comprising:
   connecting a plurality of resistance elements together in series for forming a resistance ladder;
   connecting a current source to the resistance ladder for passing a controlled current therethrough;
   connecting a plurality of switches to the plurality of resistance elements for connecting a voltage output to points on the resistance ladder between the resistance elements;
   providing a switch control circuit that includes a plurality of switch controls for sequentially closing the plurality of switches; and providing a decoding circuit for determining which switch is currently being operated, and for enabling each of the plurality of switch controls to control more than one switch of the plurality of switches.

12. A method according to claim 11, wherein the switch control circuit comprises a shift register comprising a plurality of shift register elements connected together to receive a clock signal and a token signal from the decoding circuit.

13. A method according to claim 12, wherein the decoding circuit enables the shift register to receive the token signal more than once, thereby creating a looped shift register.

14. A method according to claim 11, wherein the decoding circuit enables the switch control circuit to operate a set of switches corresponding to a set of resistive elements, the set of resistance elements being proportional, in number, to half a number of switch controls.

15. A method according to claim 14, wherein the decoding circuit receives an indication that the token signal has passed through half the number of switch controls.

16. A method for making a ramp generator comprising:

forming a resistance ladder comprising a plurality of resistance elements connected together in series and divided into rows of resistance elements;

connecting a current source to the resistance ladder for passing a controlled current therethrough;

connecting a plurality of switches to the plurality of resistance elements for connecting a voltage output to points on the resistance ladder between the resistance elements, the plurality of switches being divided into rows of switches corresponding to the rows of resistance elements;

providing a shift register comprising a plurality of shift register elements connected together for providing a plurality of switch controls for sequentially closing the plurality of switches; and providing a decoding circuit for determining which switch is currently being operated, and for enabling each of the plurality of switch controls to control more than one switch of the plurality of switches.

17. A method according to claim 16, wherein each shift register element receives a clock signal and a token signal from the decoding circuit.

18. A method according to claim 17, wherein the decoding circuit enables the shift register to receive the token signal more than once, thereby creating a looped shift register.

19. A method according to claim 16, wherein each row of resistive elements is proportional, in number, to half a number of switch controls.

20. A method according to claim 19, wherein the decoding circuit receives an indication that the token signal has passed through half the number of switch controls.

* * * * *

UNITED STATES PATENT AND TRADEMARK OFFICE
CERTIFICATE OF CORRECTION

PATENT NO. : 6,842,135 B2
DATED : January 11, 2005
INVENTOR(S) : Arnaud Laflaquiere It is certified that error appears in the above-identified patent and that said Letters Patent is hereby corrected as shown below:

Column 2,
Line 67, delete "$V_{RAMP} = 1 * I = V_m/16$" insert -- $V_{RAMP} = 1 * R_{UNIT}^{*} I = V_m/16$ --

Column 3,
Line 47, delete "restive" insert -- resistive --

Signed and Sealed this

Fourteenth Day of June, 2005

JON W. DUDAS
*Director of the United States Patent and Trademark Office*